US008122963B2

(12) United States Patent
Davis

(10) Patent No.: US 8,122,963 B2
(45) Date of Patent: Feb. 28, 2012

(54) MONITORING A SOLENOID OF A DIRECTIONAL CONTROL VALVE

(75) Inventor: Julian R Davis, Bristol (GB)

(73) Assignee: Vetco Gray Controls Limited, Nailsea, Bristol (GB)

( * ) Notice: Subject to any disclaimer, the term of this patent is extended or adjusted under 35 U.S.C. 154(b) by 339 days.

(21) Appl. No.: 12/256,068

(22) Filed: Oct. 22, 2008

(65) Prior Publication Data

US 2009/0107682 A1  Apr. 30, 2009

(30) Foreign Application Priority Data

Oct. 23, 2007  (GB) .................................. 0720690.7

(51) Int. Cl.
*E21B 34/04* (2006.01)

(52) U.S. Cl. .................... 166/336; 166/250.01; 166/373; 166/66; 166/66.6; 340/853.2

(58) Field of Classification Search .................. 166/336, 166/339, 352, 250.01, 373, 381, 386, 66, 166/66.6; 324/323, 324; 340/500, 664, 853.1, 340/853.2; 702/6, 7
See application file for complete search history.

(56) References Cited

U.S. PATENT DOCUMENTS

| | | | | |
|---|---|---|---|---|
| RE30,110 | E * | 10/1979 | Huebsch et al. ............ | 166/66.7 |
| 4,321,946 | A * | 3/1982 | Paulos et al. ................ | 137/554 |
| 4,798,247 | A | 1/1989 | Deaton et al. | |
| 4,886,114 | A * | 12/1989 | Perkins et al. .............. | 166/66.7 |
| 5,153,522 | A * | 10/1992 | Sano ............................ | 324/546 |
| 5,241,218 | A * | 8/1993 | Page ............................ | 307/104 |
| 5,245,501 | A * | 9/1993 | Locher et al. ................ | 361/154 |
| 5,424,637 | A * | 6/1995 | Oudyn et al. ............ | 324/207.16 |
| 5,481,187 | A * | 1/1996 | Marcott et al. ........... | 324/207.16 |
| 5,578,904 | A * | 11/1996 | Marcott et al. ........... | 324/207.16 |
| 5,583,434 | A * | 12/1996 | Moyers et al. ........... | 324/207.16 |
| 5,600,237 | A * | 2/1997 | Nippert .................... | 324/207.16 |
| 5,784,245 | A * | 7/1998 | Moraghan et al. ............ | 361/154 |
| 5,796,261 | A * | 8/1998 | Golab ........................ | 324/705 |
| 5,808,471 | A * | 9/1998 | Rooke et al. ................ | 324/546 |
| 5,861,746 | A * | 1/1999 | Ensten ..................... | 324/207.16 |
| 5,942,892 | A * | 8/1999 | Li ............................. | 324/207.16 |
| 6,017,017 | A * | 1/2000 | Lutz et al. ................ | 251/129.15 |
| 6,111,514 | A * | 8/2000 | Cossins et al. ................ | 340/654 |
| 6,211,665 | B1 * | 4/2001 | Ahrendt et al. .......... | 324/207.16 |
| 6,326,898 | B1 * | 12/2001 | O'Leyar et al. .............. | 340/635 |

(Continued)

FOREIGN PATENT DOCUMENTS

DE  3624231 A1  1/1988

(Continued)

OTHER PUBLICATIONS

EPODOC/EPO Abstract for DE 3624231 A1.

(Continued)

*Primary Examiner* — Thomas Beach
*Assistant Examiner* — Matthew Buck
(74) *Attorney, Agent, or Firm* — Bracewell & Giuliani LLP

(57) ABSTRACT

A method of monitoring a solenoid (1) of a directional control valve (DCV) associated with a subsea control module (6) in a subsea hydrocarbon production system is disclosed. A voltage is applied across a coil of the solenoid, for moving the armature (4) thereof, and a current through the coil is sensed to produce an indication of if and when the armature is moved.

4 Claims, 4 Drawing Sheets

U.S. PATENT DOCUMENTS

| | | | |
|---|---|---|---|
| 6,476,599 B1 * | 11/2002 | Czimmek et al. | 324/207.16 |
| 6,577,133 B1 * | 6/2003 | Barron | 324/415 |
| 6,845,300 B2 * | 1/2005 | Haghgooie et al. | 700/289 |
| 6,917,203 B1 * | 7/2005 | Perotti et al. | 324/418 |
| 7,405,917 B2 * | 7/2008 | Ahrens et al. | 361/152 |
| 7,483,253 B2 * | 1/2009 | Schumacher | 361/160 |
| 7,511,478 B2 * | 3/2009 | Ganev | 324/207.16 |
| 7,595,971 B2 * | 9/2009 | Ganev et al. | 361/160 |
| 2006/0285265 A1 | 12/2006 | Ganev et al. | |

FOREIGN PATENT DOCUMENTS

GB    2110373 A    6/1983

OTHER PUBLICATIONS

Search Report dated Feb. 7, 2008.

EP Search Report for EP 08 16 6219 dated Aug. 19, 2011 (6 pages).

* cited by examiner

MONITORING A SOLENOID OF A DIRECTIONAL CONTROL VALVE

CROSS-REFERENCE TO RELATED APPLICATION

This application claims the benefit of United Kingdom Patent Application No. 0720690.7, filed on Oct. 23, 2007, which hereby is incorporated by reference in its entirety.

FIELD OF THE INVENTION

The present invention relates to monitoring a solenoid, in particular a solenoid of a directional control valve (DCV) in a subsea hydrocarbon production control system. A DCV is an electro-mechanical device which is operated by stimulation of the coil of an electrical solenoid which induces a movement in an armature which in turn controls a fluid flow, such as a hydraulic flow.

BACKGROUND OF THE INVENTION

DCVs are employed within oil and gas industry subsea production control systems (PCSs) to control hydraulic function lines that are in turn used to open and close subsea hydraulic valves on PCS trees and manifolds. Hydraulic valve operation is fundamental to a subsea PCS and much design focus has been placed on ensuring that valve operations can be assured. A subsea PCS is inaccessible once deployed, very expensive to recover and critical to revenue stream (once operational). Therefore, a subsea PCS incorporates telemetry functions to enable DCV and associated hydraulic valve operations to be remotely monitored. PCS telemetry enables problems to be diagnosed and future problems predicted and circumvented so that recovery can be scheduled into maintenance programmes, weather windows and seasonal access windows. Any enhancement of the diagnostic capability of a PCS is therefore important.

SUMMARY OF THE INVENTION

According to the present invention from one aspect, there is provided a method of monitoring a solenoid of a directional control valve in a subsea hydrocarbon production control system, the directional control valve being associated with a subsea control module of a subsea well and the solenoid having a coil and an armature for actuating the valve, the method comprising: applying a voltage across the coil for moving the armature; and sensing a current through the coil to produce an indication of if and when the armature is moved.

Preferably, both said voltage is applied and said current is sensed subsea (for example by means in a subsea electronics module of the subsea control module), said indication being sent to a topside installation.

According to the present invention from another aspect, there is provided a subsea hydrocarbon production control system, comprising a subsea control module of a well, the control module being associated with at least one directional control valve having a solenoid which has a coil and an armature for actuating the valve, the system including means for applying a voltage across the coil for moving the armature; and means for sensing current through the coil to produce an indication of if and when the armature is moved.

DETAILED DESCRIPTION OF EMBODIMENT OF THE INVENTION

When the coil of a DCV solenoid is initially stimulated with a fixed DC voltage across it, the current profile provides a distinctive signature of the valve. The current profile exponential characteristics for a solenoid coil are readily predictable from the solenoid coil's inductance and resistance, but a DCV solenoid coil's current characteristic with a moving armature displays a distinctive jump (kick in the waveform) at the point when the armature moves in response to stimulation of the coil. The distinctive jump or kick provides a unique signature of the DCV and can be used to characterise, evaluate and diagnose armature movement (or lack of movement).

Figure 1:
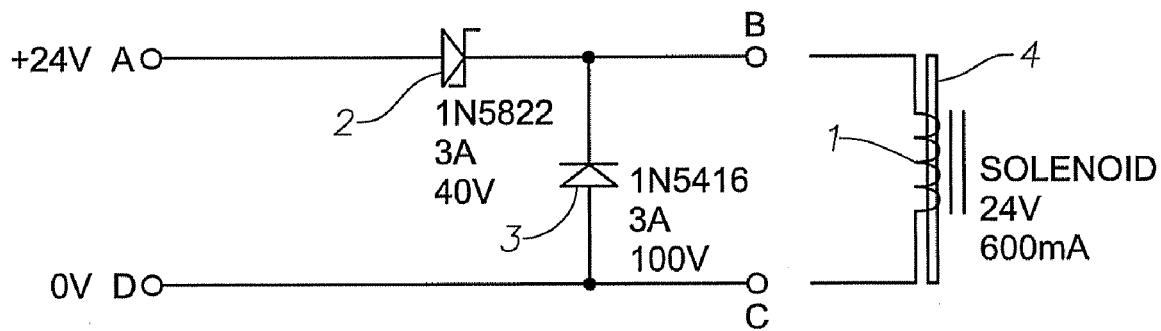
FIG. 1 shows a circuit arrangement for stimulating the coil of a solenoid of a DCV of a subsea hydrocarbon production system.

Referring first to FIG. 1, this is a circuit diagram of an arrangement used to stimulate the coil 1 of a solenoid of a DCV. The solenoid coil is connected across points B and C of the circuit arrangement, and a voltage of +24 v is applied to point A and 0 v to point D so that current passes through the coil via a diode 2, reference numeral 3 designating a flywheel diode connected between points B and C. The voltage is supplied for long enough for the armature 4 of the solenoid to be moved sufficiently and typically the current through the solenoid coil reaches a value of 600 mA. In operation, the DCV would then be in a latched condition.

To monitor a typical Vetco Gray Controls Limited DCV under different conditions, a clip-over DC current probe was placed at points A and B of the circuit arrangement and the electrical characteristics at these points were captured on an oscilloscope and screen plots of the waveforms of current against time were taken.

Figure 2A:
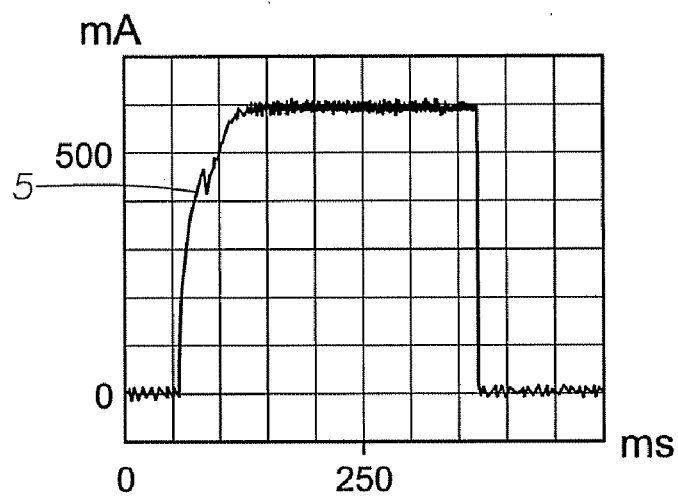
FIGS. 2a)-2n) show plots of current against time during the stimulation of the coil of such a solenoid under different conditions.
Figure 2B:
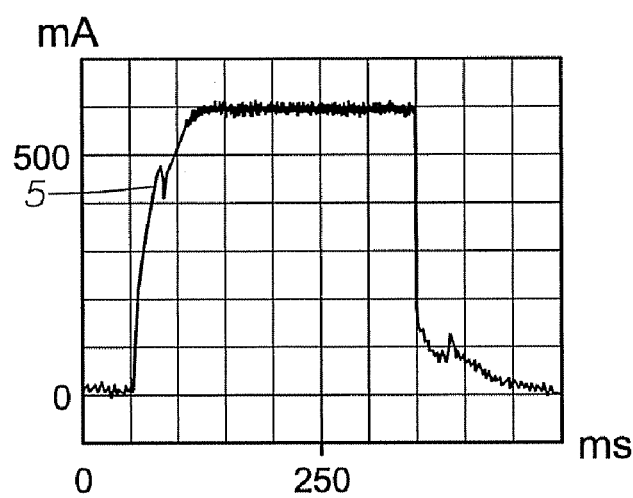

FIGS. 2a)-n) show such screen plots under different conditions, in each case current in mA being shown against time in ms.

FIGS. 2a) and 2b) show the waveforms observed at points A and B respectively with a void around the armature 4 of the DCV filled with free air and no hydraulic pressure applied against the armature.

Figure 2C:
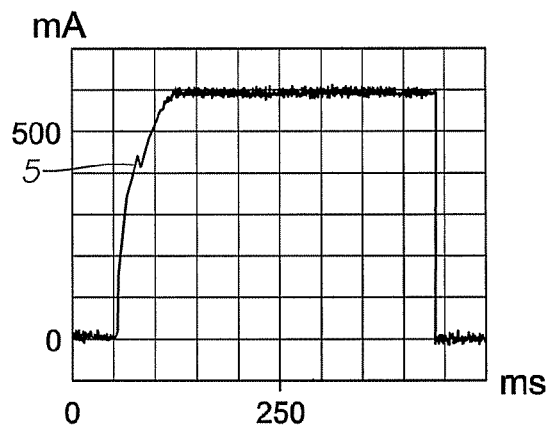
Figure 2D:
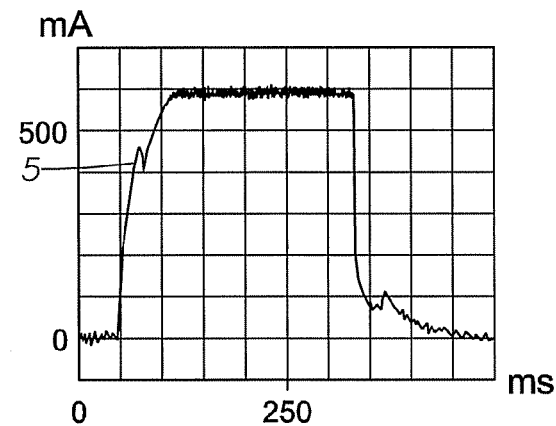

FIGS. 2c) and 2d) show the waveforms observed at points A and B respectively with a void around the armature 4 filled with air and an applied hydraulic pressure against the armature of 300 bars.

Figure 2E:
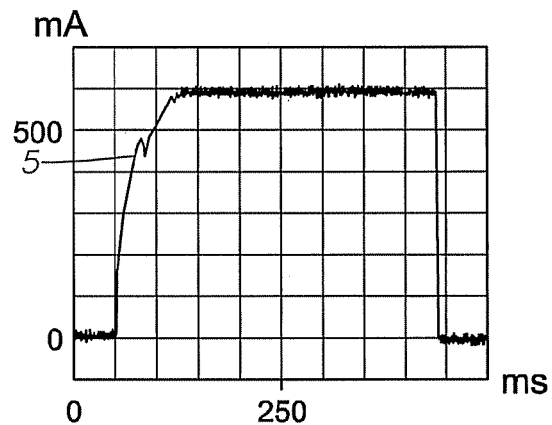
Figure 2F:
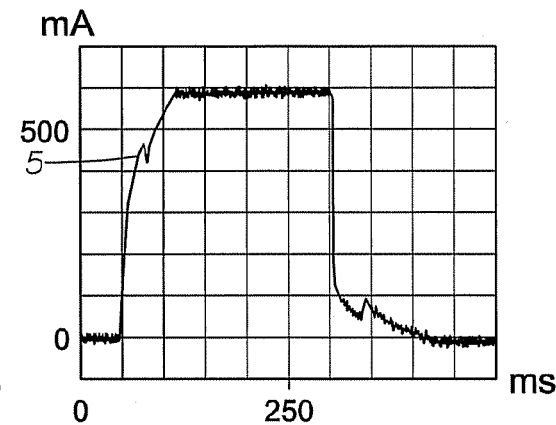

FIGS. 2e) and 2f) show the waveforms observed at points A and B respectively with a void around the armature 4 filled with oil and no hydraulic pressure applied against the armature.

Figure 2G:
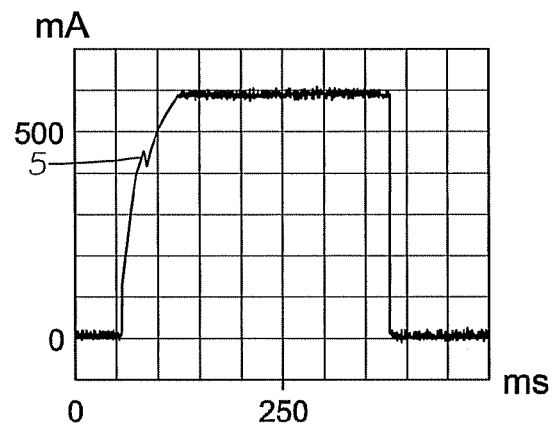
Figure 2H:
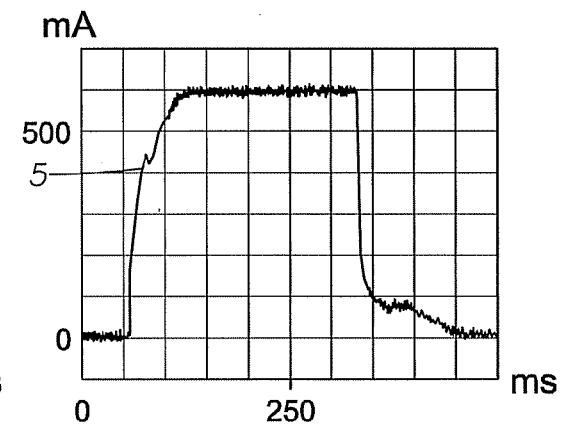

FIGS. 2g) and 2h) show the waveforms at points A and B respectively with a void around the armature 4 filled with oil and an applied hydraulic pressure against the armature of 300 bars.

It will be noted in the above waveforms that, as the current increases up to 600 mA, there is a distinct kick or jump 5 in the waveform—this occurring at the point when the armature 4 moves in response to stimulation of the solenoid coil 1. An instantaneous drop in the current at turn-off of the voltage (when measurements are taken at point A) is indicative of correct operation of the flywheel diode 3.

Also, possible movement of the armature 4 was adjusted in the coil to demonstrate the effects of over-travel, full travel and restricted travel on the electrical characteristics at point B.

Figure 2I:
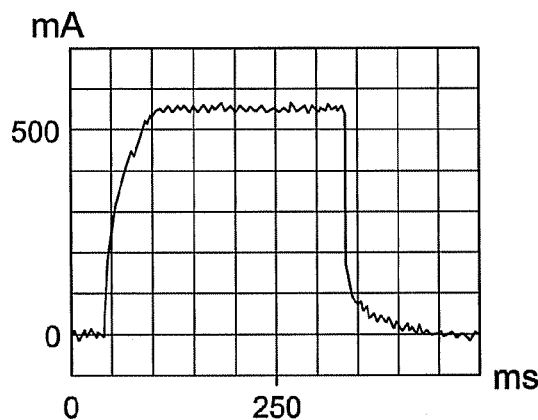
Figure 2J:
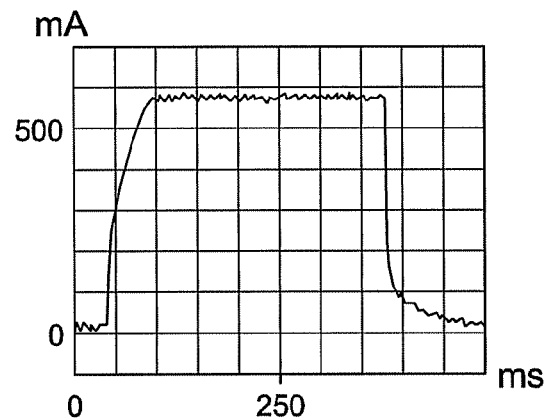

FIGS. 2*i*) and 2*j*) show the waveforms which occurred at point B when the armature 4 was made to have a zero displacement with free air around the armature and no hydraulic pressure applied against the armature and free air around the armature with an applied hydraulic pressure against the armature of 320 bars respectively. It will be noted that there is no discernible jump or kick 5 in either of these waveforms.

Figure 2K:
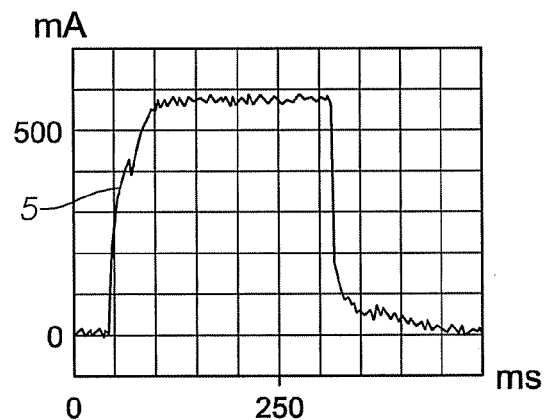
Figure 2L:
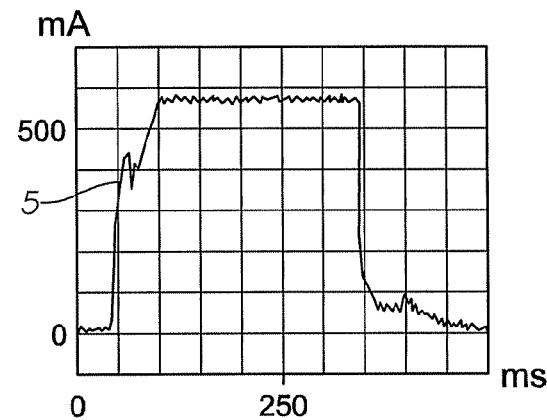

FIGS. 2*k*) and 2*l*) show the waveforms which occurred at point B when the armature movement of the coil is set for a full travel of 0.15-0.25 mm displacement with free air around the armature 4 and no hydraulic pressure applied against the armature and free air with an applied hydraulic pressure against the armature of 320 bars respectively.

Figure 2M:
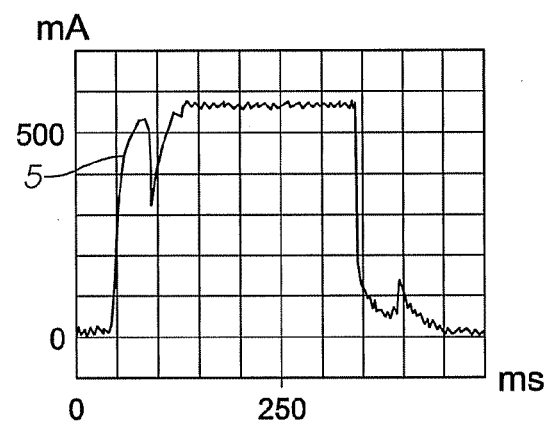
Figure 2N:
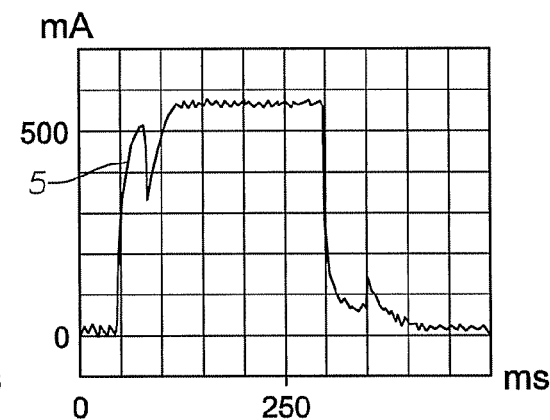

FIGS. 2*m*) and 2*n*) show the waveforms which occurred when the armature 4 is set to have a maximum possible displacement (so-called over-travel) with free air around the armature and no hydraulic pressure applied against the armature and free air with an applied hydraulic pressure against the armature of 320 bars respectively.

It will be noted that in FIGS. 2*k*)-2*n*) a discernible jump or kick 5 appears as in FIGS. 2*a*)-2*h*).

Figure 3:
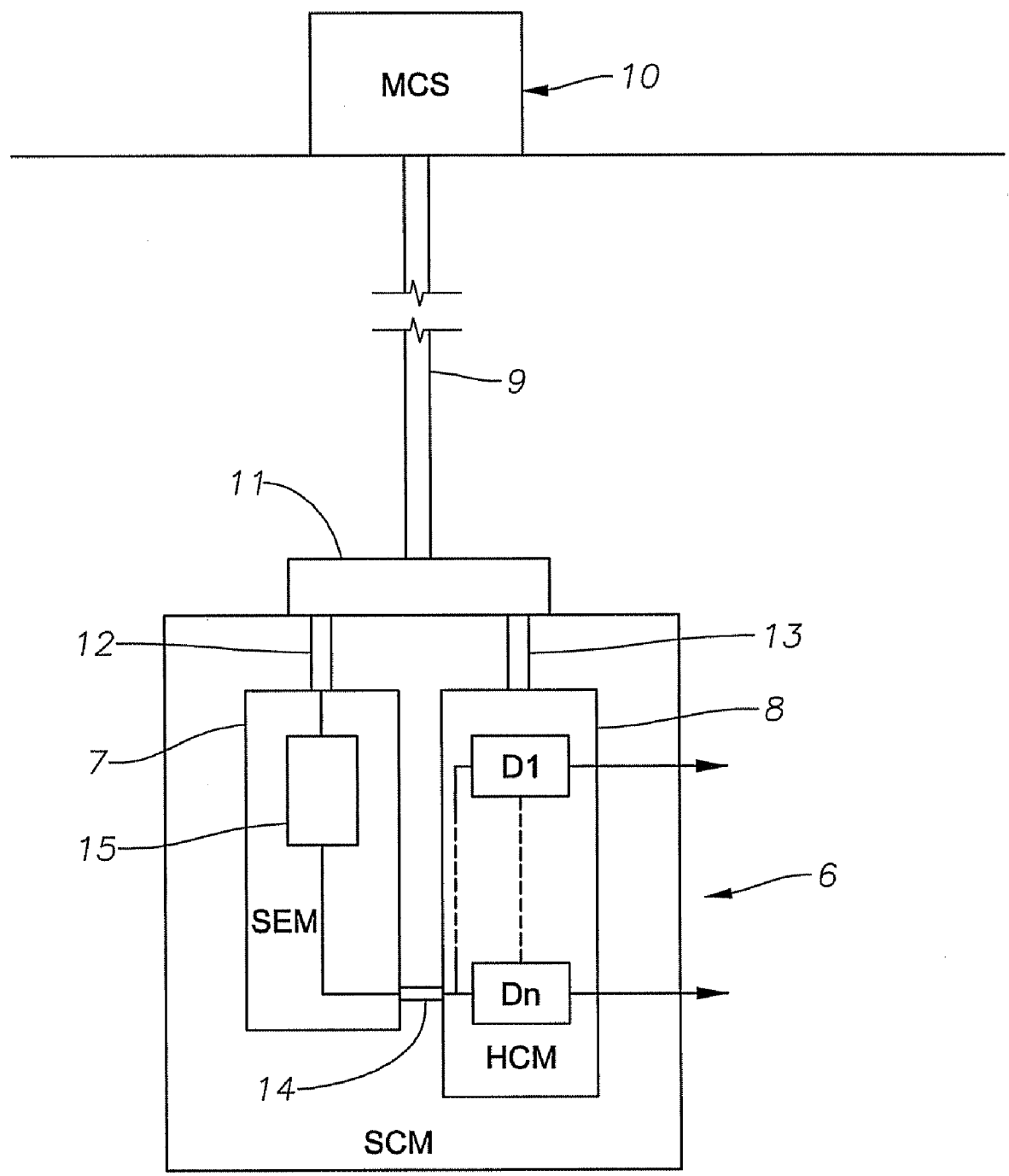
FIG. 3 is a schematic diagram of an embodiment of a production control system according to the invention.

In practice, and referring to FIG. 3, which shows schematically a subsea hydrocarbon production control system incorporating the invention, DCV solenoid coil current signature data acquisition hardware and associated software are implemented within a subsea modular pod comprising a subsea control module (SCM) with a subsea electronics module (SEM). Profile display, diagnostics and health monitoring software are implemented in a topside master control station (MCS). More particularly, in a subsea control module (SCM) 6 there is a subsea electronics module (SEM) 7 and a hydraulic control module (HCM) 8. The SCM 6 is fed by an umbilical 9 from a topside master control station (MCS) 10, e.g. at a surface platform, with electric power, control signals and hydraulic power. The control signals are processed by the SEM 7 which then controls electrically operated, hydraulic directional control valves (DCVs) D1-Dn in the HCM 8 which in turn operate a multiplicity of hydraulic devices such as actuators for controlling a subsea hydrocarbon production well. The subsea control system is centralised within a well tree, the SCM 7 being connected to the umbilical 9 via a distribution unit 11 which provides the electric power and control signals to the SEM 7 via a cable 12 and hydraulic power to the HCM 8 via a feed 13. The SEM 7 controls the DCVs D1-Dn in the HCM 8 via a cable 14.

Also, the SEM 7 samples the actuation currents of the solenoids of DCVs D1-Dn as described above and stores a sampled and digitised coil actuation current profile for each of the DCVs in the memory of a local processing core 15 where the data can be assessed for armature movement and from where the data can be retrieved and sent to the MCS 10 for operator display and scrutineering.

Measuring and recording the solenoid coil actuation current signature provides a means of remotely monitoring the following DCV characteristics:—

DCV armature seizure—i.e. no travel detected following stimulation of the DCV solenoid coil.

DCV armature travel—i.e. distance travelled by the armature upon stimulation of the DCV solenoid coil.

DCV armature travel change over product life. The DCV solenoid coil actuation current signature (in the field) can be compared with that obtained as a reference during an equipment factory acceptance test to assess potential degradation and change of the valve's performance over the operational life of the DCV.

DCV valve operation—i.e. good/bad assessment. Automatic interpretation of the DCV solenoid coil actuation current signature (by the SEM) enables a good/bad valve operation indication to be relayed to the remote user. Full signature retrieval can be requested (if a bad valve operation is flagged) for more detailed evaluation/scrutineering.

Solenoid coil current turn off signature can also be employed to establish that the solenoid coil flywheel diode is in circuit and operational.

The invention claimed is:

1. A method of monitoring a solenoid of a directional control valve in a subsea hydrocarbon production control system, the directional control valve being associated with a subsea control module of a subsea well and the solenoid having a coil and an armature for actuating the valve, the method comprising:

applying a voltage across the coil subsea by means in a subsea electronics module of the subsea control module for moving the armature;

sampling an actuation current of the coil of the solenoid subsea by means in the subsea electronics module of the subsea control module over a predetermined period of time to produce measurements providing an indication of if and when the armature is moved;

storing the measurements for the solenoid in a storing means in the subsea electronics module of the subsea control module to create a digitized profile for the solenoid of the directional control valve; and remotely monitoring the profile by means at a topside installation to assess degradation of the solenoid.

2. A method according to claim 1, wherein said subsea control module is at a tree of the subsea well.

3. A subsea hydrocarbon production control system, comprising a subsea control module of a well, the control module being associated with at least one directional control valve having a solenoid which has a coil and an armature for actuating the valve, the system comprising:

means in a subsea electronics module of the subsea control module for applying a voltage across the coil subsea for moving the armature;

means in the subsea electronics module of the subsea control module for sampling an actuation current of the coil of the solenoid subsea over a predetermined period of time to produce measurements providing an indication of if and when the armature is moved;

means in the subsea electronics module of the subsea control module for storing the measurements for the solenoid to create a digitized profile for the solenoid of the directional control valve; and means at a topside installation for remotely monitoring the profile to assess degradation of the solenoid.

4. A system according to claim 3, wherein said subsea control module is at a tree of the subsea well.

* * * * *